United States Patent
Kim et al.

(10) Patent No.: US 10,338,815 B2
(45) Date of Patent: *Jul. 2, 2019

(54) MULTI-CHANNEL NONVOLATILE MEMORY POWER LOSS MANAGEMENT

(71) Applicant: International Business Machines Corporation, Armonk, NY (US)

(72) Inventors: Kyu-Hyoun Kim, Chappaqua, NY (US); Kevin Mcilvain, Delmar, NY (US); Adam J. McPadden, Underhill, VT (US); Nandita A. Mitra, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/807,855

(22) Filed: Nov. 9, 2017

(65) Prior Publication Data
US 2018/0356982 A1 Dec. 13, 2018

Related U.S. Application Data

(63) Continuation of application No. 15/616,048, filed on Jun. 7, 2017, now Pat. No. 10,168,905.

(51) Int. Cl.
*G06F 3/06* (2006.01)
*G11C 7/10* (2006.01)
(Continued)

(52) U.S. Cl.
CPC .......... *G06F 3/0604* (2013.01); *G06F 3/0653* (2013.01); *G06F 11/073* (2013.01);
(Continued)

(58) Field of Classification Search
CPC .... G06F 3/0604; G06F 3/0653; G06F 11/073; G11C 16/04; H01L 2924/1423
See application file for complete search history.

(56) References Cited

U.S. PATENT DOCUMENTS

| | | | |
|---|---|---|---|
| 2012/0089854 A1* | 4/2012 | Breakstone | G06F 1/30 713/323 |
| 2013/0198459 A1* | 8/2013 | Joshi | G06F 12/084 711/130 |

(Continued)

OTHER PUBLICATIONS

List of IBM Patents or Patent Applications Treated as Related, Nov. 9, 2017, 2 pages.

(Continued)

*Primary Examiner* — Jerome Leboeuf
(74) *Attorney, Agent, or Firm* — Cantor Colburn LLP; Bryan Bortnick

(57) ABSTRACT

A nonvolatile queue manager queues entries of host data from one or more host channels to one or more write buffers for storage in one or more nonvolatile memory devices of a nonvolatile memory array. The nonvolatile queue manager compares a number of the entries queued to one or more nonvolatile memory holdup power write thresholds based on detecting a power loss event. The nonvolatile queue manager tracks one or more locations in the nonvolatile memory array targeted by one or more of the entries extending beyond the one or more nonvolatile memory holdup power write thresholds. The nonvolatile queue manager initiates a mitigation action on a subsequent restoration of power to handle the one or more locations in the nonvolatile memory array targeted by one or more of the entries extending beyond the one or more nonvolatile memory holdup power write thresholds.

6 Claims, 6 Drawing Sheets

(51) Int. Cl.
*G11C 16/04* (2006.01)
*G06F 11/07* (2006.01)
*G11C 29/02* (2006.01)
*G11C 16/10* (2006.01)
*G11C 29/04* (2006.01)

(52) U.S. Cl.
CPC ............ *G11C 7/1087* (2013.01); *G11C 16/04* (2013.01); *G11C 29/022* (2013.01); *G11C 29/028* (2013.01); *G11C 7/1039* (2013.01); *G11C 16/102* (2013.01); *G11C 2029/0409* (2013.01); *H01L 2924/1423* (2013.01)

(56) References Cited

U.S. PATENT DOCUMENTS

2014/0304560 A1* 10/2014 Narasimha .......... G06F 11/0727 714/704
2015/0089287 A1* 3/2015 Jayakumar ................ G06F 1/30 714/23

OTHER PUBLICATIONS

U.S. Appl. No. 15/616,048, filed Jun. 7, 2017, Entitled: Multi-Channel Nonvolatile Memory Management, First Named Inventor: Kyu-Hyoun Kim.

* cited by examiner

MULTI-CHANNEL NONVOLATILE MEMORY POWER LOSS MANAGEMENT

DOMESTIC PRIORITY

This application is a continuation of U.S. patent application Ser. No. 15/616,048, filed Jun. 7, 2017, the disclosure of which is incorporated by reference herein in its entirety.

BACKGROUND

The present invention generally relates to computer memory systems, and more specifically, to multi-channel nonvolatile memory management.

Memory systems may make use of nonvolatile memory to retain data between power cycling that would otherwise be lost if stored in volatile memory, such as dynamic random access memory (DRAM). A computer system can incorporate multiple nonvolatile memory technologies with different performance attributes. Even when nonvolatile memory devices of the same technology type are used in a computer system, timing variations can exist between each memory device.

SUMMARY

Embodiments of the present invention are directed to a computer-implemented method for multi-channel nonvolatile memory management. A non-limiting example of the computer-implemented method includes queuing, by a nonvolatile queue manager, entries of host data from one or more host channels to one or more write buffers for storage in one or more nonvolatile memory devices of a nonvolatile memory array. The nonvolatile queue manager compares a number of the entries queued in the one or more write buffers to one or more nonvolatile memory holdup power write thresholds based on detecting a power loss event. The nonvolatile queue manager tracks one or more locations in the nonvolatile memory array targeted by one or more of the entries extending beyond the one or more nonvolatile memory holdup power write thresholds. The nonvolatile queue manager initiates a mitigation action on a subsequent restoration of power to handle the one or more locations in the nonvolatile memory array targeted by one or more of the entries extending beyond the one or more nonvolatile memory holdup power write thresholds.

Embodiments of the present invention are directed to a system for multi-channel nonvolatile memory management. A non-limiting example of the system includes one or more nonvolatile memory devices of a nonvolatile memory array, one or more write buffers operable to write to the one or more nonvolatile memory devices, and a nonvolatile queue manager. The nonvolatile queue manager is configured to queue entries of host data from one or more host channels to the one or more write buffers for storage in the one or more nonvolatile memory devices of the nonvolatile memory array and compare a number of the entries queued in the one or more write buffers to one or more nonvolatile memory holdup power write thresholds based on detection of a power loss event. The nonvolatile queue manager is further configured to track one or more locations in the nonvolatile memory array targeted by one or more of the entries extending beyond the one or more nonvolatile memory holdup power write thresholds and initiate a mitigation action on a subsequent restoration of power to handle the one or more locations in the nonvolatile memory array targeted by one or more of the entries extending beyond the one or more nonvolatile memory holdup power write thresholds.

Embodiments of the invention are directed to a computer program product for multi-channel nonvolatile memory management, the computer program product including a computer readable storage medium having program instructions embodied therewith. In a non-limiting example, the program instructions are executable by processing circuitry to cause the processing circuitry to perform queuing, by a nonvolatile queue manager, entries of host data from one or more host channels to one or more write buffers for storage in one or more nonvolatile memory devices of a nonvolatile memory array. The nonvolatile queue manager compares a number of the entries queued in the one or more write buffers to one or more nonvolatile memory holdup power write thresholds based on detecting a power loss event. The nonvolatile queue manager tracks one or more locations in the nonvolatile memory array targeted by one or more of the entries extending beyond the one or more nonvolatile memory holdup power write thresholds. The nonvolatile queue manager initiates a mitigation action on a subsequent restoration of power to handle the one or more locations in the nonvolatile memory array targeted by one or more of the entries extending beyond the one or more nonvolatile memory holdup power write thresholds.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
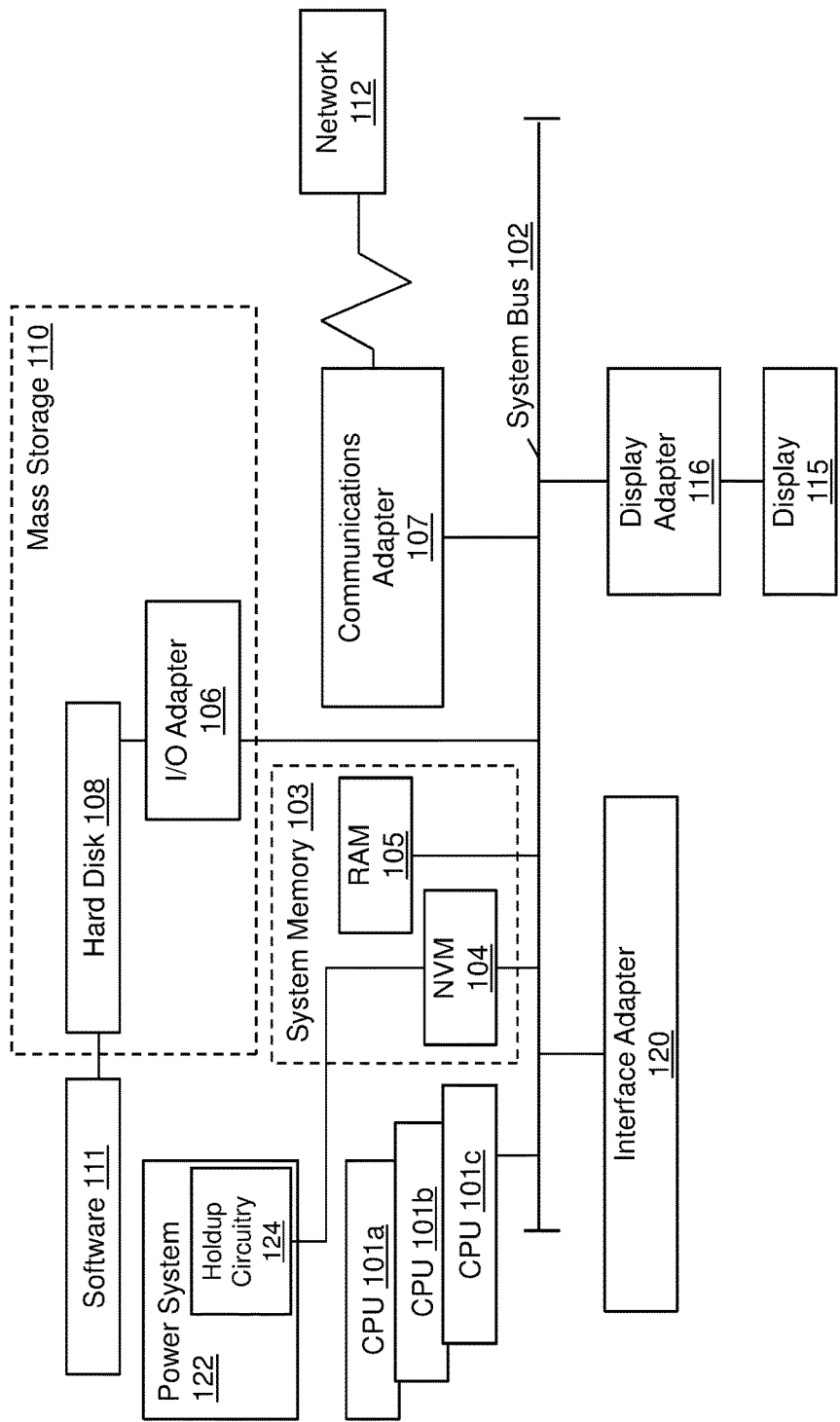
FIG. 1 depicts a processing system according to one or more embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, nonvolatile memory devices can be written to upon a power loss event using holdup circuitry to temporarily extend power to retain the state of memory between power cycles. A holdup time defines the maximum time available to continue performing writes to nonvolatile memory while the holdup circuitry provides a temporary power source. For example, capacitance circuits can be used to extend available power after a power loss event to perform writes from volatile memory to the nonvolatile memory before the available supply voltage drops below a minimum usable voltage threshold to complete writes to the nonvolatile memory. Once the available supply voltage of holdup circuitry decays below the minimum usable threshold voltage, no further writes to nonvolatile memory can be performed and any data not yet written to the nonvolatile memory is typically lost.

Turning now to an overview of the aspects of the invention, one or more embodiments of the invention address the above-described shortcomings of the prior art by using a nonvolatile queue manager (NQM) to monitor writes queued for nonvolatile memory storage from multiple channels on a power loss. The NQM can distinguish between queued writes that should have time to complete before a power holdup period expires and writes that will not be able to complete as queued. The NQM can dynamically determine and adjust thresholds for each channel that account for different nonvolatile memory types, power supply status, and other factors that impact the number of expected nonvolatile memory write cycles to complete before holdup power is also lost.

The above-described aspects of the invention address the shortcomings of the prior art by tracking locations of values that were not updated before the power holdup period expired to support taking mitigation actions on the next power up cycle. Mitigation actions can include recovering data if it was stored to another location prior to the loss of holdup power or alerting a host if corrupted locations are not directly recoverable by the NQM. Technical effects and benefits include flagging and/or capturing writes queued to nonvolatile memory that would otherwise fail due to queued entries in write buffers extending beyond an expected holdup time of the power system. In embodiments, the state of data stored in nonvolatile memory after a power loss is known, which removes the risk of partially corrupted values being retained without knowledge of the problem. Shifting queued writes between buffers of other channels can allow storage of recovery data that would not have otherwise been captured. Recovery data can be stored in the nonvolatile memory of another channel, in the NQM, or in a reserved overflow storage area of nonvolatile memory, for example.

Turning now to a more detailed description of aspects of the present invention, FIG. 1 depicts an example of a processing system 100 for implementing the teachings herein. In this embodiment, the processing system 100 has one or more central processing units (processors) 101a, 101b, 101c, etc. (collectively or generically referred to as processor(s) 101). The processors 101, also referred to as processing circuits/circuitry, are coupled via a system bus 102 to a system memory 103 and various other components. The system memory 103 can include a nonvolatile memory (NVM) system 104 and a random access memory (RAM) system 105. The NVM system 104 includes one or more nonvolatile memory devices that retain values between the cycling of power and can be coupled to system bus 102 along with other types of memory. RAM system 105 can include a plurality of read-write (volatile) memory devices, such as dynamic RAM (DRAM), coupled to system bus 102 for use by the processors 101. The system memory 103 can be organized in memory modules, such as dual-inline memory modules, in a planar configuration, in a stacked configuration, and/or combinations thereof. Various forms of hosting (virtualizing) multiple instances of operating systems can be supported by the processors 101 and system memory 103 to establish multiple host channels within the processing system 100.

FIG. 1 further depicts an input/output (I/O) adapter 106 and a communications adapter 107 coupled to the system bus 102. I/O adapter 106 may be a small computer system interface (SCSI) adapter that communicates with a hard disk 108 and/or any other similar component. I/O adapter 106 and hard disk 108 are collectively referred to herein as mass storage 110. Software 111 for execution on the processing system 100 may be stored in mass storage 110. The mass storage 110 is an example of a tangible storage medium readable by the processors 101, where the software 111 is stored as instructions for execution by the processors 101 to perform all or a portion of a method, such as the process 600 of FIG. 6 as further described herein. Communications adapter 107 interconnects the system bus 102 with an outside network 112 enabling processing system 100 to communicate with other such systems. A display 115 is connected to system bus 102 via a display adapter 116, which may include a graphics controller to improve the performance of graphics intensive applications and a video controller. In one embodiment, adapters 106, 107, and 116 may be connected to one or more I/O buses that are connected to the system bus 102 via an intermediate bus bridge (not shown). Suitable I/O buses for connecting peripheral devices such as hard disk controllers, network adapters, and graphics adapters typically include common protocols, such as PCI. Additional input/output devices can be connected to the system bus 102 via an interface adapter 120 and the display adapter 116. A keyboard, a mouse, and/or a speaker can be interconnected to the system bus 102 via the interface adapter 120, which may include, for example, a Super I/O chip integrating multiple device adapters into a single integrated circuit.

Thus, as configured in FIG. 1, the processing system 100 includes processing capability in the form of processors 101, and, storage capability including the system memory 103 and the mass storage 110, input means such as keyboard and mouse, and output capability including speaker and the display 115. In one embodiment, a portion of the system memory 103 and the mass storage 110 collectively store one or more operating systems, such as the z/OS or AIX operating system from IBM Corporation, to coordinate the functions of the various components shown in FIG. 1.

A power system 122 can provide conditioned power at various voltage levels to elements of the processing system 100. In an embodiment, when the power system 122 experiences a power loss event (e.g., a shutdown), holdup circuitry 124 can continue to provide holdup power to the NVM system 104 for a period of time. For example, the holdup circuitry 124 can be a capacitive circuit that outputs a holdup voltage level for a period of time to allow data to be copied from RAM system 105 to NVM system 104 to be retained during shutdown. The period of time that the holdup circuitry 124 outputs a holdup voltage level to the NVM system 104 can vary depending on whether the holdup circuitry 124 was fully charged, load demands on the holdup circuitry 124, environmental factors (e.g., temperature), and the like, which are generally referred to as one or more holdup power characteristics. The amount of data/number of write operations to the NVM system 104 that can be performed while holdup circuitry 124 is active can depend on one or more characteristics of nonvolatile memory devices that are embodied within NVM system 104 (e.g., latency, bus width, throughput, device age effects, etc.).

Figure 2:
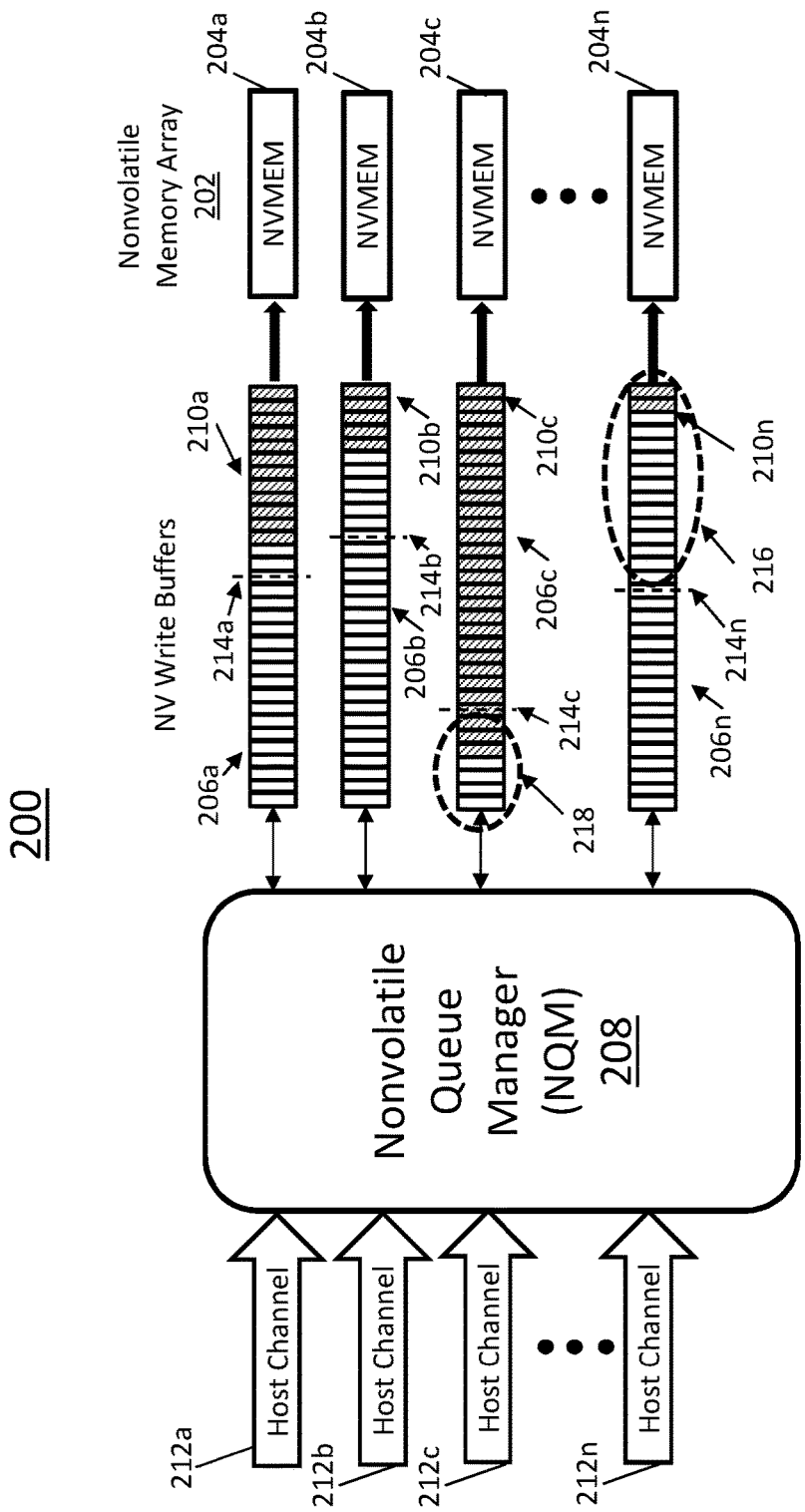
FIG. 2 depicts a multi-channel nonvolatile memory system according to one or more embodiments.

FIG. 2 depicts a multi-channel nonvolatile memory system 200 (also referred to as system 200) according to one or more embodiments as an example of the NVM system 104 of FIG. 1. The system 200 includes a nonvolatile memory array 202 that includes a plurality of nonvolatile memory devices 204a, 204b, 204c, . . . , 204n. The system 200 also includes a plurality of write buffers 206a, 206b, 206c, . . . , 206n operable to write to the nonvolatile memory devices 204a-204n. A nonvolatile queue manager (NQM) 208 is configured to queue entries 210a, 210b, 210c, . . . , 210n of host data from host channels 212a, 212b, 212c, . . . , 212n to the write buffers 206a-206n for storage in the nonvolatile memory devices 204a-204n of the nonvolatile memory array 202 and compare a number of the entries 210a-210n queued in the write buffers 206a-206n to nonvolatile memory holdup power write thresholds 214a, 214b, 214c, . . . , 214n based on detection of a power loss event. A power loss event may be detected by the NQM 208 based on a discrete signal from power system 122 and/or holdup circuitry 124 of FIG. 1, a comparator-based circuit, and analog-to-digital voltage monitor circuitry or other techniques known in the art.

The NQM 208 is further configured to track one or more locations in the nonvolatile memory array 202 targeted by one or more of the entries 210a-210n extending beyond the nonvolatile memory holdup power write thresholds 214a-214n and initiate a mitigation action on a subsequent restoration of power to handle the one or more locations in the nonvolatile memory array 202 targeted by the entries extending beyond the nonvolatile memory holdup power write thresholds 214a-214n. The positioning of the nonvolatile memory holdup power write thresholds 214a-214n can vary for corresponding write buffers 206a-206n such that a greater number of entries 210a in write buffer 206a are expected to be written to nonvolatile memory devices 204a than the number of entries 210b in write buffer 206b expected to be written to nonvolatile memory devices 204b in a same period of time while a holdup voltage is available. Similarly, a greater number of entries 210c in write buffer 206c are expected to be written to nonvolatile memory devices 204c than the number of entries 210a in write buffer 206a expected to be written to nonvolatile memory devices 204a in a same period of time while the holdup voltage is available. Region 216 depicts an example of entries 210n of write buffer 206n that are expected to be written to nonvolatile memory devices 204 (less than nonvolatile memory holdup power write threshold 214n) before the holdup voltage is lost/substantially reduced. Region 218 depicts an example of entries 210c of write buffer 206c that would not typically be written to nonvolatile memory devices 204c (greater than nonvolatile memory holdup power write threshold 214c) before the holdup voltage is lost/substantially reduced.

Mitigation actions can include providing a record of locations that were not successfully updated such that a host/application can be informed about which locations in the nonvolatile memory array 202 are valid or invalid. As one example, the NQM 208 can perform rebalancing of the write buffers 206a-206n by shifting one or more of the entries 210a-210n queued in the write buffers 206a-206n to at least one of the write buffers 206a-206n having none of the entries 210a-201n extending beyond the nonvolatile memory holdup power write thresholds 214a-214n. For instance, entries 210c in region 218 could be shifted into region 216 of write buffer 206n to ensure that the entries 210c extending beyond the nonvolatile memory holdup power write threshold 214c are not lost when holdup power from holdup circuitry 124 of FIG. 1 is lost/substantially reduced. Values intended to be written to nonvolatile memory devices 204c can be stored in nonvolatile memory devices 204n until power is restored. Upon the next power up, the values intended to be written to nonvolatile memory devices 204c can be copied from nonvolatile memory devices 204n to nonvolatile memory devices 204c to restore the intended state of the nonvolatile memory array 202. Various types of tracking mechanisms and mitigation actions can be used to handle entries in region 218, as further described with respect to the examples of FIGS. 3-5

Figure 3:
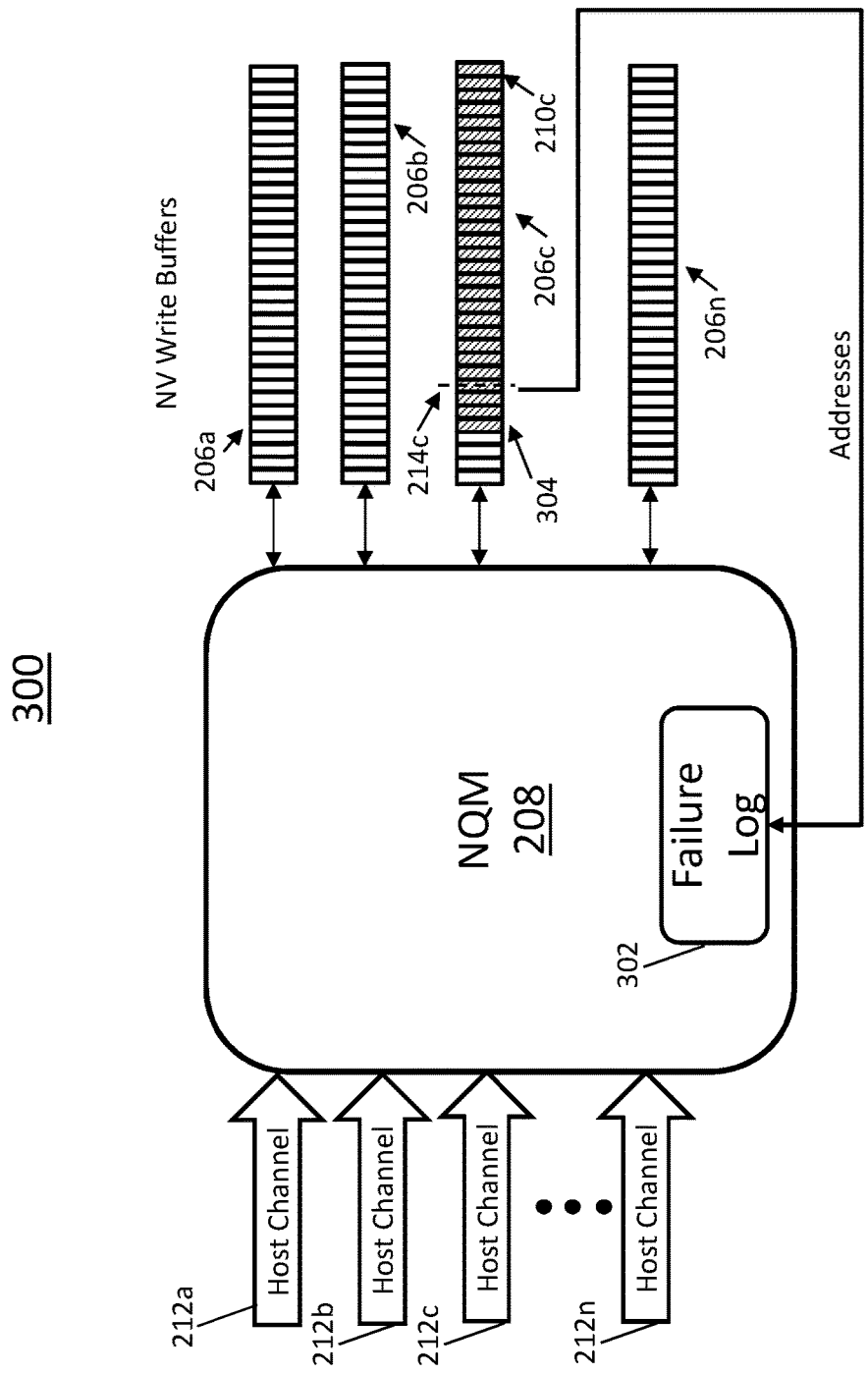
FIG. 3 depicts a multi-channel nonvolatile memory system with a failure log according to one or more embodiments.

FIG. 3 depicts a multi-channel nonvolatile memory system 300 (also referred to as system 300) with a failure log 302 according to one or more embodiments as an example of the NVM system 104 of FIG. 1. In the example of FIG. 3, the NQM 208 includes failure log 302 to store one or more addresses 304 of one or more locations in the nonvolatile memory array 202 of FIG. 2 for tracking as targeted by one or more entries 210c extending beyond the nonvolatile memory holdup power write threshold 214c. The addresses 304 stored in the failure log 302 can indicate which locations are invalid in the nonvolatile memory array 202 of FIG. 2 on the next power up. The failure log 302 can be a reduced-size nonvolatile memory storage area within the NQM 208. As a mitigation action, the NQM 208 can report the one or more addresses 304 to a host or application program on the processors 101 of FIG. 1 for further processing, such as recreating values intended to be stored at the addresses 304 or clearing out data values intended to be stored at the addresses 304. By logging which locations are invalid based on the failure log 302, the full data set stored in the nonvolatile memory array 202 of FIG. 2 does not need to be invalidated and/or recreated.

Figure 4:
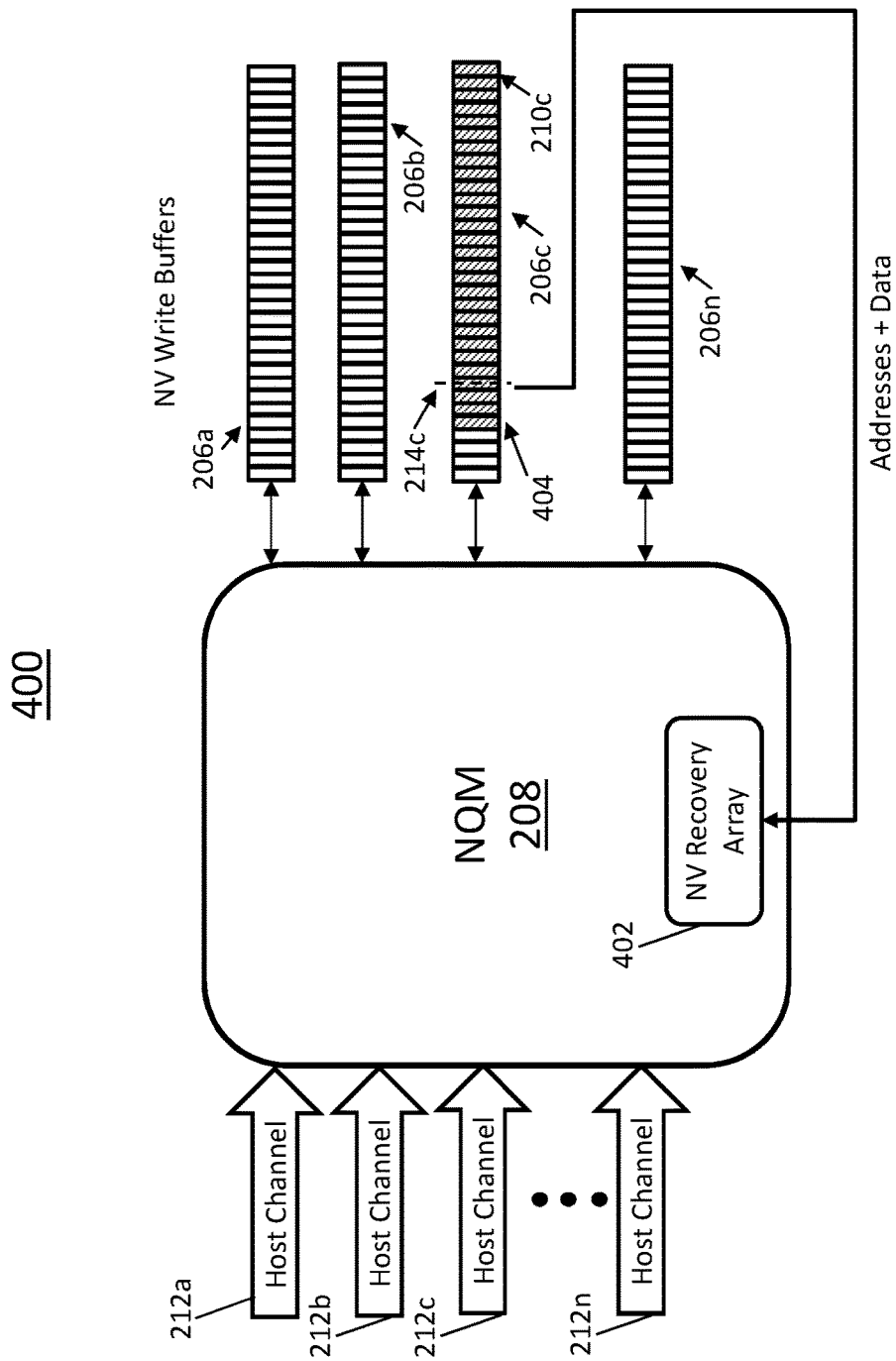
FIG. 4 depicts a multi-channel nonvolatile memory system with a recovery array according to one or more embodiments.

FIG. 4 depicts a multi-channel nonvolatile memory system 400 (also referred to as system 400) with a recovery array 402 according to one or more embodiments as an example of the NVM system 104 of FIG. 1. In the example of FIG. 4, the NQM 208 includes recovery array 402 to store data and addresses 404 of one or more locations in the nonvolatile memory array 202 of FIG. 2 targeted by one or more of the entries 210c extending beyond the nonvolatile memory holdup power write threshold 214c. The data and addresses 404 stored in the recovery array 402 can indicate which locations are invalid in the nonvolatile memory array 202 of FIG. 2 on the next power up and the data values that were intended to be written. The recovery array 402 can be a nonvolatile memory storage area within the NQM 208. As a mitigation action, the NQM 208 can read the data and addresses 404 from the recovery array 402 and write the data back to the intended addresses in the nonvolatile memory array 202 of FIG. 2 on a subsequent restoration of power.

Figure 5:
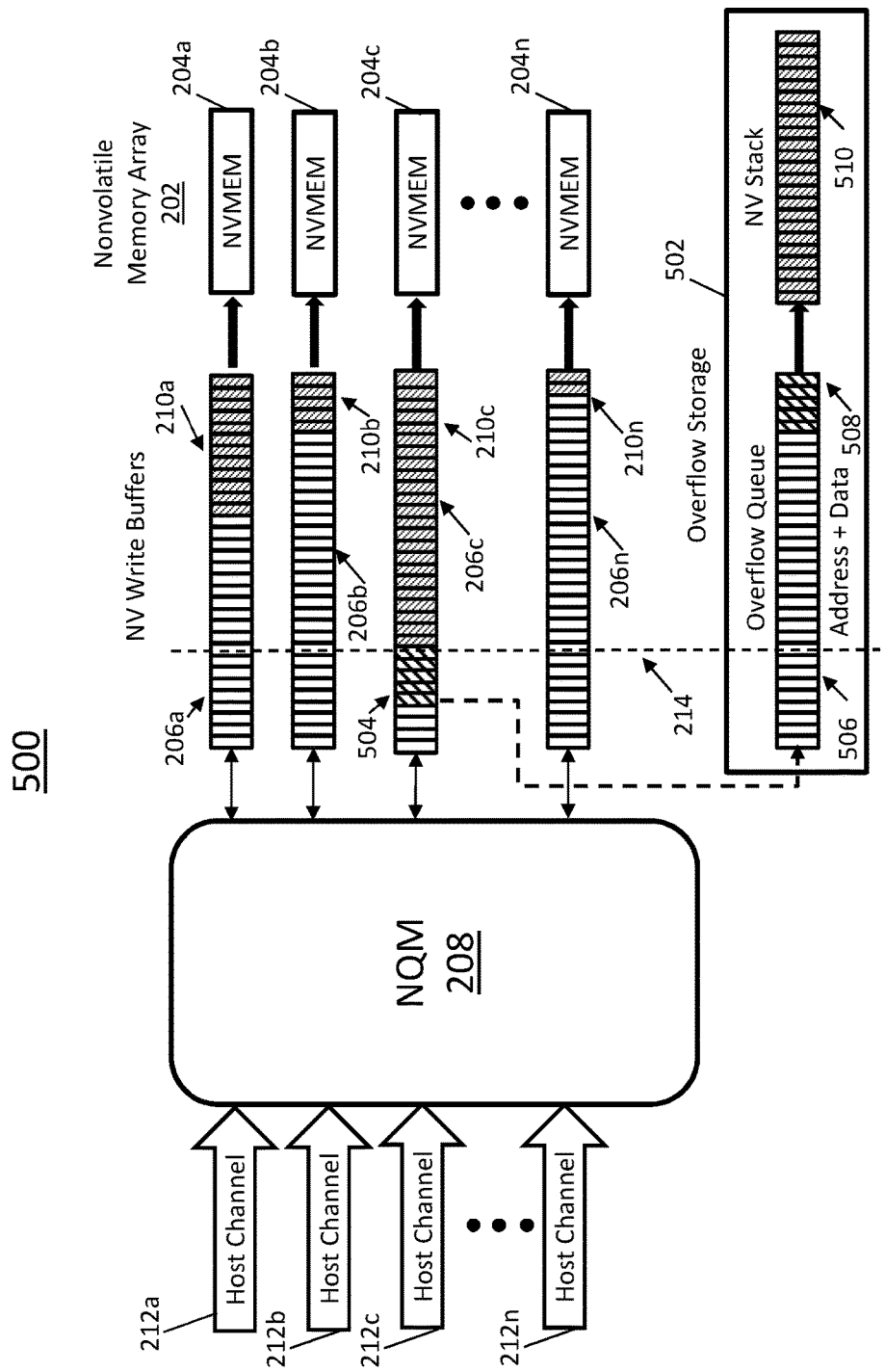
FIG. 5 depicts a multi-channel nonvolatile memory system with overflow storage according to one or more embodiments.

FIG. 5 depicts a multi-channel nonvolatile memory system 500 (also referred to as system 500) with overflow storage 502 according to one or more embodiments as an example of the NVM system 104 of FIG. 1. In the example of FIG. 5, the overflow storage 502 can be external to the NQM 208. The NQM 208 can perform transferring one or more of the entries 504 extending beyond the one or more nonvolatile memory holdup power write thresholds 214 to an overflow queue 506 of the overflow storage 502 as one or more entries 508, which can include data and address value intended to be stored in the nonvolatile memory array 202. The one or more entries 508 can be shifted from the overflow queue 506 to a nonvolatile memory stack 510 that provides a supplemental nonvolatile storage area of the overflow storage 502. The nonvolatile memory stack 510 can be implemented as a first-in-first-out (FIFO) stack that stores data and addresses from the one or more entries 508. The nonvolatile memory stack 510 can receive values targeting any of the nonvolatile memory devices 204a-204n based on a respective instance of the write buffers 206a-206n exceeding the nonvolatile memory holdup power write threshold 214. Values in the nonvolatile memory stack 510 can be retained as a separate nonvolatile memory store that is used to restore the nonvolatile memory 202 state on a subsequent restoration of power, for instance, as managed by NQM 208. While the example of FIG. 5 uses a single instance of the nonvolatile memory holdup power write threshold 214 that is shared, in alternate embodiments, multiple nonvolatile memory holdup power write thresholds 214a-214n (FIG. 2) can be implemented.

Figure 6:
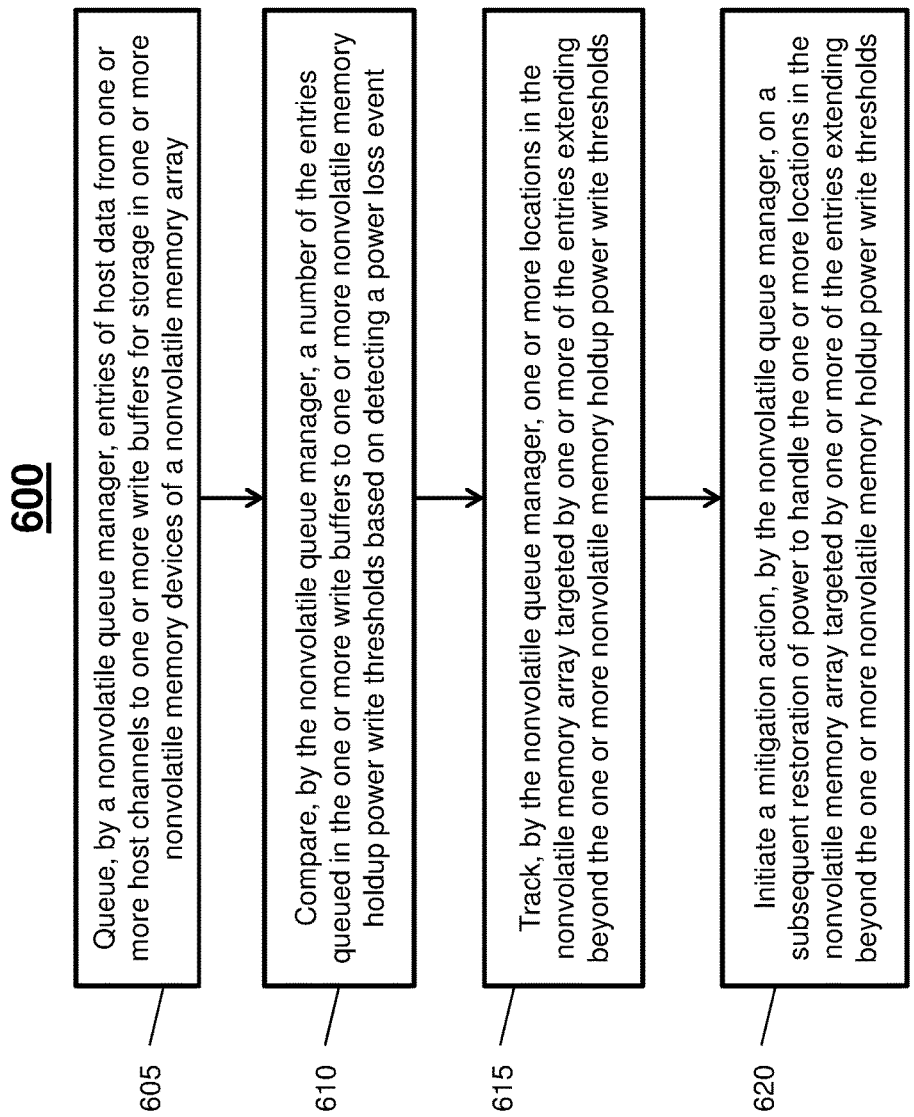
FIG. 6 depicts an example process flow for multi-channel nonvolatile memory management according to one or more embodiments.

Turning now to FIG. 6, a flow diagram of a process 600 for multi-channel nonvolatile memory management is generally shown in accordance with an embodiment. The process 600 is described with reference to FIGS. 1-5 and may include additional steps beyond those depicted in FIG. 6.

At block 605, NQM 208 queues entries 210a-210n of host data from one or more host channels 212a-212n to one or more write buffers 206a-206n for storage in one or more nonvolatile memory devices 204a-204n of a nonvolatile memory array 202. Host data received on host channels 212a-212n may be a value from the RAM system 105 to retain between cycling of power, such that the state of the RAM system 105 can be rapidly restored when a sufficient level of power returns.

At block 610, NQM 208 compares a number of the entries 210a-210n queued in the one or more write buffers 206a-206n to one or more nonvolatile memory holdup power write thresholds 214a-214n based on detecting a power loss event. The NQM 208 can dynamically adjust the one or more nonvolatile memory holdup power write thresholds 214a-214n associated with the one or more write buffers 206a-206n based on one or more characteristics of the one or more nonvolatile memory devices 204a-204n that are written to from the one or more write buffers 206a-206n. Additionally or alternatively, the NQM 208 can dynamically adjust the one or more nonvolatile memory holdup power write thresholds 214a-214n associated with the one or more write buffers 206a-206n based on one or more holdup power characteristics, for instance, that may impact how much longer the holdup power from holdup circuitry 124 is expected to be sufficient to successfully store values to respective nonvolatile memory devices 204a-204n.

At block 615, NQM 208 tracks one or more locations in the nonvolatile memory array 202 targeted by one or more of the entries 210a-210n extending beyond the one or more nonvolatile memory holdup power write thresholds 214a-214n. Tracking can be performed using various elements, such as the failure log 302, recovery array 402, overflow storage 502, and/or other storage elements.

At block 620, NQM 208 initiates a mitigation action on a subsequent restoration of power to handle the one or more locations in the nonvolatile memory array 202 targeted by one or more of the entries 210a-210n extending beyond the one or more nonvolatile memory holdup power write thresholds 214a-214n. The mitigation action can be in the form of an alert that particular locations are invalid or can be a restoration process to place the nonvolatile memory array 202 in the intended state prior to a loss of holdup power.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for multi-channel nonvolatile memory management, the computer-implemented method comprising:
   queuing, by a nonvolatile queue manager, entries of host data from one or more host channels to one or more write buffers for storage in one or more nonvolatile memory devices of a nonvolatile memory array;
   comparing, by the nonvolatile queue manager, a number of the entries queued in the one or more write buffers to one or more nonvolatile memory holdup power write thresholds based on detecting a power loss event;
   tracking, by the nonvolatile queue manager, one or more locations in the nonvolatile memory array targeted by one or more of the entries extending beyond the one or more nonvolatile memory holdup power write thresholds;
   initiating a mitigation action, by the nonvolatile queue manager, on a subsequent restoration of power to handle the one or more locations in the nonvolatile memory array targeted by one or more of the entries extending beyond the one or more nonvolatile memory holdup power write thresholds; and
   rebalancing the one or more write buffers by shifting one or more of the entries queued in the one or more write buffers to at least one of the one or more write buffers having none of the entries extending beyond the one or more nonvolatile memory holdup power write thresholds.

2. The computer-implemented method of claim 1, further comprising:
   dynamically adjusting the one or more nonvolatile memory holdup power write thresholds associated with the one or more write buffers based on one or more characteristics of the one or more nonvolatile memory devices that are written to from the one or more write buffers.

3. The computer-implemented method of claim 1, further comprising:
   dynamically adjusting the one or more nonvolatile memory holdup power write thresholds associated with the one or more write buffers based on one or more holdup power characteristics.

4. The computer-implemented method of claim 1, wherein the tracking comprises storing, in a failure log of the nonvolatile queue manager, one or more addresses of the one or more locations in the nonvolatile memory array targeted by one or more of the entries extending beyond the one or more nonvolatile memory holdup power write thresholds, and the mitigation action comprises reporting the one or more addresses.

5. The computer-implemented method of claim 1, wherein the tracking comprises storing, in a recovery array of the nonvolatile queue manager, data and one or more addresses of the one or more locations in the nonvolatile memory array targeted by one or more of the entries extending beyond the one or more nonvolatile memory holdup power write thresholds, and the mitigation action comprises writing the data from the recovery array to the one or more addresses on the subsequent restoration of power.

6. The computer-implemented method of claim 1, further comprising:
   transferring one or more of the entries extending beyond the one or more nonvolatile memory holdup power write thresholds to an overflow queue; and
   shifting the one or more entries from the overflow queue to a nonvolatile memory stack comprising a supplemental nonvolatile storage area.

* * * * *